United States Patent [19]

Olk

[11] 3,878,001

[45] Apr. 15, 1975

[54] METHOD OF MAKING A HYPERSENSITIVE SEMICONDUCTOR TUNING DIODE

[75] Inventor: Gunter Olk, Munich, Germany

[73] Assignee: Siemens Aktiengesellschaft, Berlin and Munich, Germany

[22] Filed: Nov. 29, 1973

[21] Appl. No.: 420,158

Related U.S. Application Data

[60] Division of Ser. No. 359,708, May 14, 1973, abandoned, which is a continuation of Ser. No. 159,280, July 2, 1971, abandoned.

[30] Foreign Application Priority Data

July 13, 1970 Germany ........................... 2034717

[52] U.S. Cl. .................. 148/186; 148/189; 357/13; 357/14; 357/89; 357/90

[51] Int. Cl. ............................ H01l 7/34; H01l 7/44

[58] Field of Search ........ 148/186, 189; 357/13, 14, 357/89, 90

[56] References Cited

UNITED STATES PATENTS 3,392,067 7/1968 Horiba et al. ...................... 148/186

OTHER PUBLICATIONS

Nathanson et al., "On Multiplication and Avalanche...Junctions," IEEE Trans. on Electron Devices, Vol. Ed. 10, No. 1, Jan. 1963, p. 44–51.

*Primary Examiner*—L. Dewayne Rutledge
*Assistant Examiner*—W. G. Saba
*Attorney, Agent, or Firm*—Herbert L. Lerner

[57] ABSTRACT

A hypersensitive tuning diode with optimum parameters such as basic doping of the semiconductor material, doping profile, area of the p-n junction, whose capacitance versus voltage exhibits substantially no inversion points.

2 Claims, 7 Drawing Figures

METHOD OF MAKING A HYPERSENSITIVE SEMICONDUCTOR TUNING DIODE

DESCRIPTION OF THE INVENTION

This is a division of application Ser. No. 359,708, filed May 14, 1973, and now abandoned; which is a continuation of Ser. No. 159,280, filed July 2, 1971, and now abandoned.

The invention relates to a hypersensitive semiconductor tuning diode. More particularly, the invention relates to a hypersensitive tuning diode in which the curve of the capacitance, as a function of the reverse voltage applied to the diode, is optimized for given requirements.

Hypersensitive tuning diodes having a large capacitance variation exhibit undesirable inversion points in the curve of the capacitance as a function of the applied reverse voltage. Furthermore, diodes of this type which have been manufactured under the same condition show large amounts of scattering in their capacitance values.

A hypersensitive capacitance versus voltage curve may be obtained by forming a p-n junction in a region of decreasing doping. To accomplish this, a basic material is first doped with one carrier type. It is, for example, possible to use silicon doped with phosphorus. It is assumed that the doping concentration of the basic material is $N_B$. Doping substances are diffused into the basic material in a first diffusion process. The doping substances produce the same conductivity type or type of conductivity as the basic material. It is therefore possible to use, for example, phosphorus for the first diffusison. A second diffusion process with a doping material of the other conductivity type produces a p-n junction in the region of decreasing doping of the first diffusion. It is, for example, possible to use boron as the doping material of the other conductivity type.

The known tuning diodes manufactured by the afordescribed method have the aforementioned unfavorable properties.

An object of the invention is to provide hypersensitive tuning diodes in which the disadvantages of the known diodes are avoided by optimizing the design parameters to the extent possible.

An object of the invention is to provide a tuning diode which largely avoids undersired effects in the capacitance versus voltage curve.

An object of the invention is to provide a tuning diode in which capacitance variations of a batch of diodes are reduced.

An object of the invention is to provide a tuning diode which permits the prediction of the technical realizability of given requirements of the diode.

Another object of the invention is to provide a tuning diode which permits statements of the value of the design parameters in a simple manner.

In accordance with the invention, a semiconductor body with a base doping concentration $N_B$ of one conductivity type exhibits in the semiconductor body a retrograded doping profile produced by a first diffusion with a doping material of the one conductivity type. A heavily doped zone of the other conductivity type is provided in the semiconductor body and is produced by a second diffusion in such a manner that a p-n junction is formed between the zone of the one conductivity type and the zone of the other conductivity type. For the desired values $$A = \frac{V_2 + V_0}{V_1 + V_0}$$

and $$r = C_1/C_2$$

the ratio $W_1/z$ is so selected tht the parameter $a = N_B/N_0$ has its maximum possible value, $N_0 z$ has a maximum value of $2.84 \cdot 10^{12}$ $cm^{-2}$, and the area of the p-n junction is made as small as possible. Here, $z$ is a quantity characterizing the gredient of the doping profile with the dimension of a length, $V_0$ is the "offset" voltage, $A$ the voltage variation between the two voltages $V_2$ and $V_1$, $r$ is the capacitance variation between the two capacitances $C_2$ and $C_1$, $C_1$ and $C_2$ are the capacitances at the voltages $V_1$ and $V_2$, respectively, $W_1$ is the space charge width prevailing at the voltage $V_1$ and $N_0$ is the doping concentration centration prevailing a the point of the subsequent p-n junction after the first diffusion.

The parameter $a$ is equal to or larger than $6.1 \cdot 10^{-3}$. When the paratmeter $a$ has this value, no inversion points occur in the capacitance-voltage curve.

In order that the invention may be readily carried into effect, it will now be described with reference to the accompanying drawings, wherein:

FIG. 1 is a graphical presentation of the doping curve of the diode;

FIG. 1*a* is a sectional view of the diode of the invention;

Figures 1, 1A, 2:
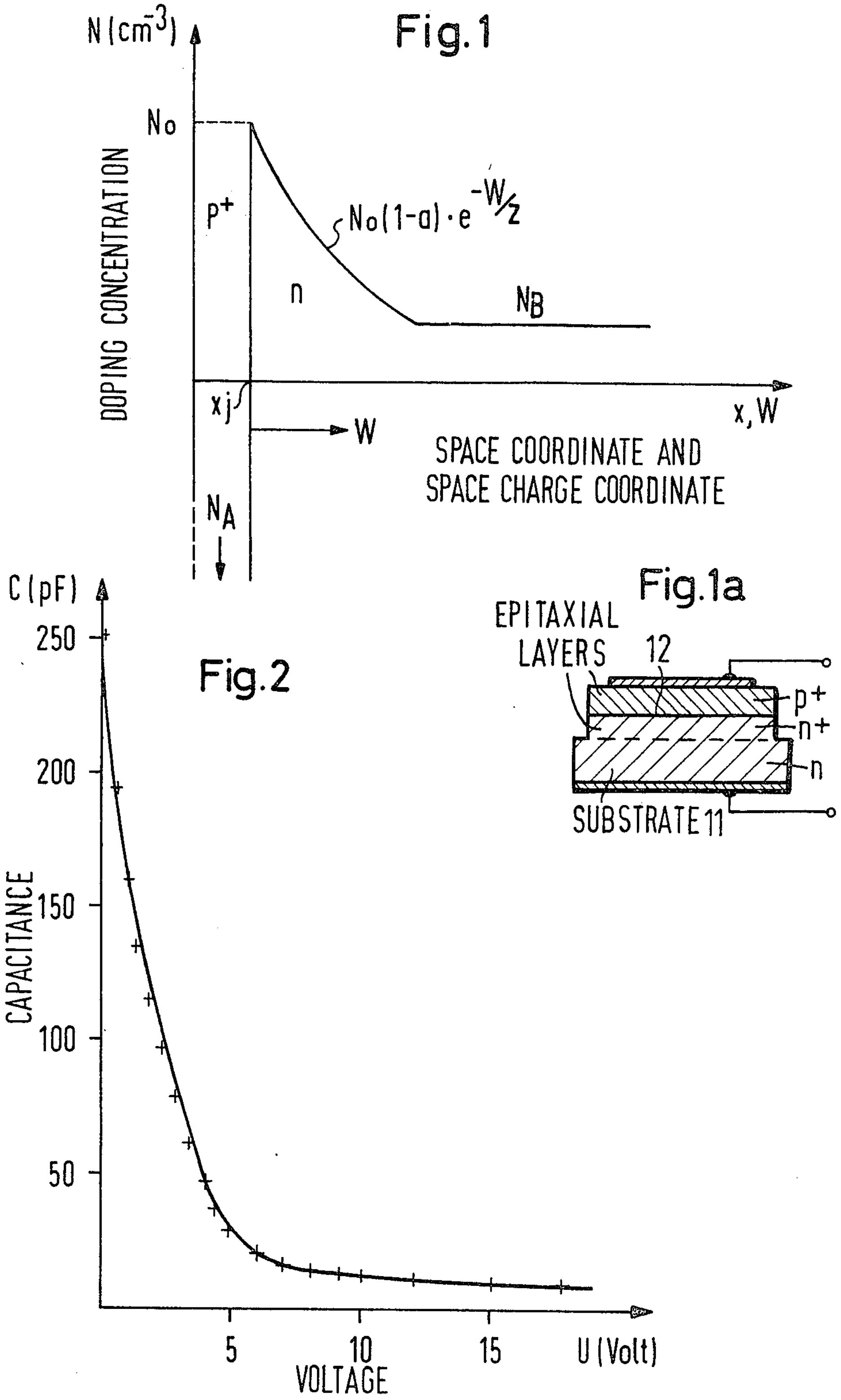
FIG. 2 is a graphical presentation of the capacitancevoltage curve of the diode.

The dependence of the doping concentration N in a semiconductor body on the space coordinate $x$ is shown in FIG. 1. The basic semiconductor material or substrate 11 (FIG. 1*a*) has s doping concentration $N_B$ (FIG. 1). A first diffusion produces a zone of retrograded, or decreasing doping, the shape of which is assumed to be $N_0(1-a)\, e^{-W/z}$, where $W$ is the space charge or depletion region coordinate. A second diffusion produces an abrupt p-n junction 12 (FIG. 1*a*) with a doping concentration $N_A \rightarrow -\infty$. It is assumed that the zone to the left of $x_j$ in FIG. 1 is heavily p-doped and the region to the right of it is n-doped. Thus, upon the application of a reverse voltage, the space charge zone spreads only into the zone of $n$ conductivity type with the retrograded doping caused by the first diffusion.

An exponential shape may be assumed for the doping profile in sufficient approximation:

$$N(W) = N_B + N_0(1-a)\, e^{-W/z} \qquad (1)$$

The space charge coordinate $W$ is counted here starting from the p-n step $x_j$. The value of $$a = N_B/N_0 \qquad (2)$$

is a parameter essential for the manufacture of the tuning diode. $N_0$ is the doping concentration which is produced at the poing $x_j$ by the first diffusion, before the second diffusion is completed. The gradient of the doping profile produced by the second diffusion is indicated by the quantity $z$. When $N_0 >> N_B$ and for a doping profile according to Equation (1), for example, the doping changes by one order of magnitude over the distance 2.3 $z$.

For an impurity distribution according to Equation (1), a theoretical derivation provides the following interrelation between the applied reverse voltage $V$, defined as positive in the reverse direction, and the space charge width $W$:

$$\frac{\epsilon\epsilon_0}{q}(V+V_0) = \tfrac{1}{2}N_nW^2 + N_0(1-a)\,z^2\,(1-(1+W/z)\,e^{-W/z}) \qquad (3)$$

where: $\epsilon_0 = 8.86 \cdot 10^{-4}$ A sec/V cm and is the absolute dielectric constant, $\epsilon$ is the relative dielectric constant of the semiconductor material, which is 12 for silicon, $q = 1.6 \cdot 10^{19}$ A sec and is the electric elementary charge, and $V_0$ is the offset voltage, as described in the Journal of Applied Physics, Vol. 38, No. 5, pages 2,148 - 2,153.

In the first approximation, $V_0 = 0.9\ V + 0.12\ V \log_{10} N_0/10^{17}$. Since the space charge width $W$ is related to the capacitance C by the equation $$C = (\epsilon\epsilon_0\ F)/W \qquad (4)$$

wherein $F$ is the area of the p-n junction, the relation between the capacitance $C$ and the voltage $V$ is also set forth by Equation (3) if the area $F$ is known. The capacitance may be measured experimentally as a function of the voltage, so that Equation (3) may be checked.

FIG. 2 shows the test result by means of an example. The solid curve of FIG. 2 represents the experimentally recorded curve of the capacitance versus the voltage. In FIG. 2, the crosses show the calculated values according to Equation (3). The deviations are smaller than 10%, so that the theoretical model with the assumed doping distribution represents the conditions in the completed component quite well. From this we may conclude that Equation (3) may be used as the basis for further considerations aimed at optimally determining the design parameters of the tuning diode.

It may be shown that no monotonically decreasing capacitance-voltage relation is obtained, but rather that two inversion points occur in this curve if the parameter $a$ is chosen as less than $6.1 \cdot 10^{-3}$. As hereinbefore mentioned, these inversion points cause trouble in the completed component. A value of $a \geqq 6.1 \cdot 1L^{-3}$ should therefore be the goal.

Figures 3, 6:
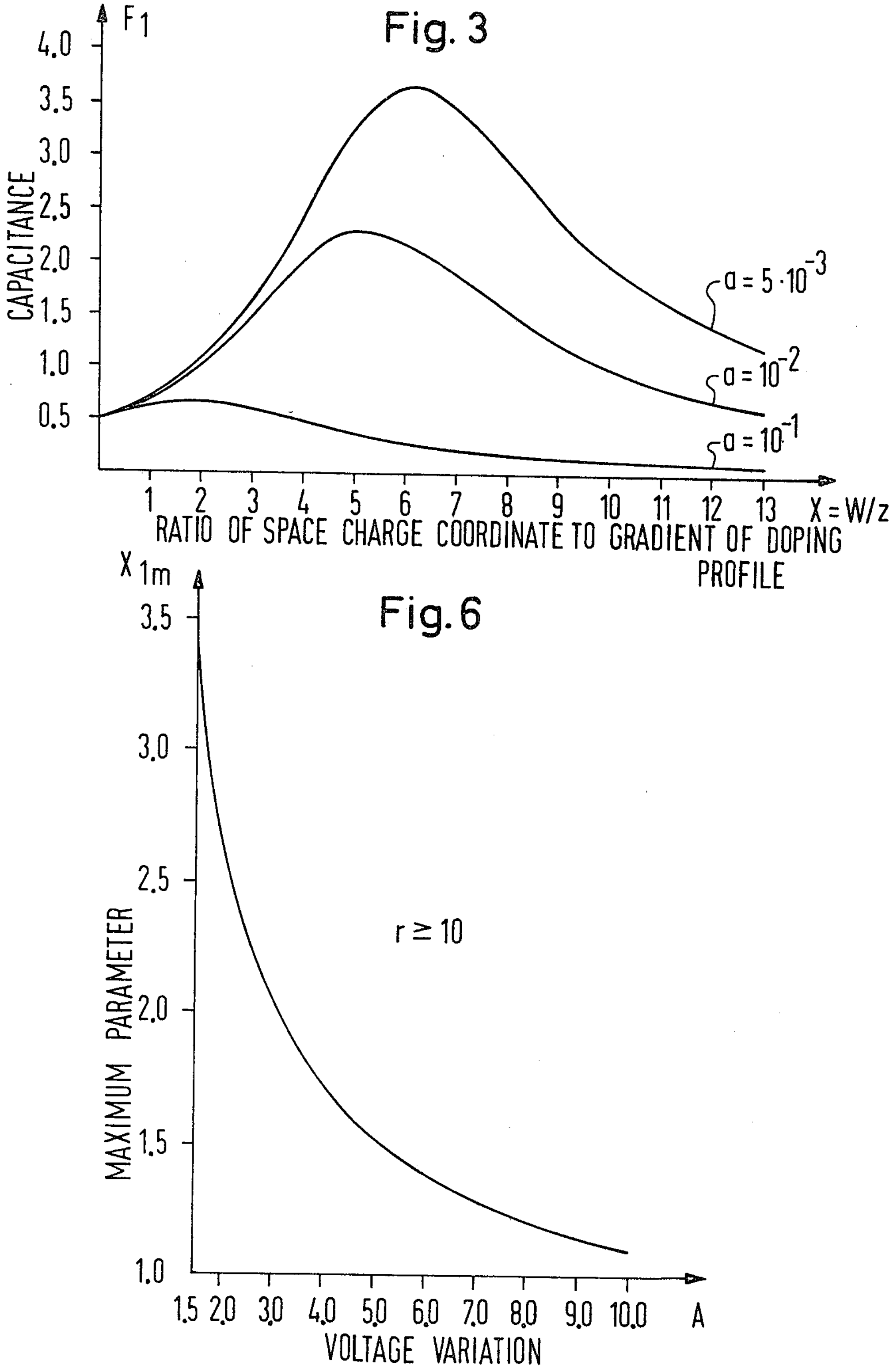
FIG. 3 is a graphical presentation of the variations in the capacitance values.
FIG. 6 is a graphical presentation to enable calculation of $x_{1m}$.

It may further be shown that unavoidable variations in production of the concentration value $N_0$ by $\Delta N_0$ lead to variations of the capacitance, which are the larger, the smaller the value of $a$. As an illustration, the factor $F_1$ of the relation $$\frac{\Delta C}{C} \approx -\frac{\Delta W}{W} = F_1\ \frac{\Delta N_0}{N_0}$$

with $$F_1\,(W/z) = \frac{1-(1+W/z)e^{-W/z}}{(W/z)^2(a+(1-a)e^{-W/z})}$$

is shown in FIG. 3 versus the normalized space charge coordinate $W/z$ with $a$ as parameter. The values $10^{-1}$, $10^{-2}$ and $5 \cdot 10^{-3}$ were selected here for the parameter $a$.

In order to avoid inversion points and to narrow down capacitance variations as far as possible, it is advisable, as may also be seen from FIG. 3, to select a value as large as possible for $a$. In FIG. 3, the abscissa represents $x = W/z$ and the ordinate represents $F_1$.

An examination is now made of what maximum value of $a$ is possible if the following requirements are to be met which are normally demanded of the diode component. The capacitance variation between the voltage values $V_1$ and $V_2$ is to be $$r = \frac{C(V_1)}{C(V_2)} = C_1/C_2 = W_2/W_1$$

The pair of values $V_1$, $W_1$ and then the pair of values $V_2$, $W_2 = rW_1$ are entered into Equation (3) and the two equations obtained in this manner are divided by each other. The result is $$\frac{V_2 + V_0}{V_1 + V_0} = A = \frac{\tfrac{1}{2}\,\frac{a}{1-a}(r\,x_1)^2 + f(r\,x_1)}{\tfrac{1}{2}\,\frac{a}{1-a}x_1^2 + f(x_1)} \qquad (5)$$

wherein the following abbreviations are used:

$$x_1 = W_1/z \qquad (5a)$$

$$f(x_1) = 1 - (1+x_1)\,e^{-x_1} \qquad (5b)$$

The voltage variation is again A. Equation (5) may be solved for $a/(1-a)$ and results in $$a/(1-a) = (2/(r^2-A))\ \frac{A\,F(x_1) - F(r\,x_1)}{x_1^2} \qquad (6)$$

Figure 4:
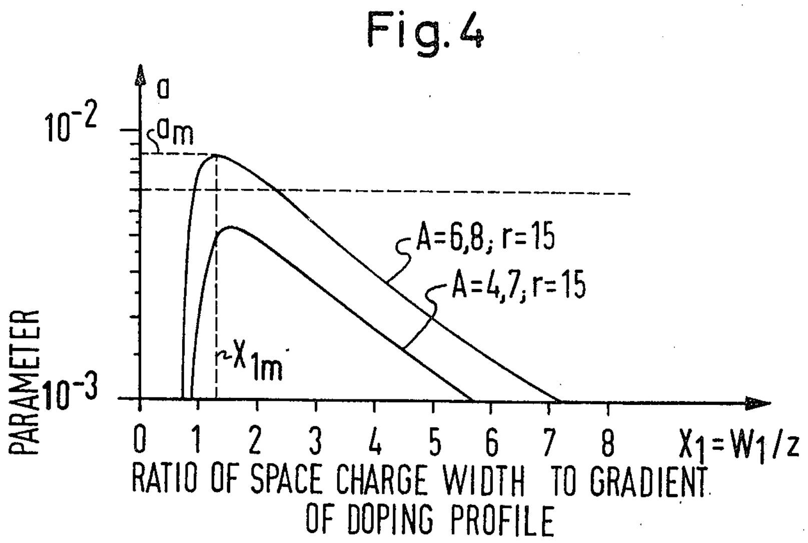
FIG. 4 is a graphical presentation of the variation of the parameter $a$ with $W_1/z$.

For given values of $r$ and $A$, Equation (6) yields a relation between $a$ and $x_1$. This relation is shown in FIG. 4 for two pairs of values $r$, $A$. In FIG. 4, the abscissa represents $x_1 = W_1/z$ and the ordinate represents $a$. These pairs of values are $$A = 6.8;\ r = 15$$

and $$A = 4.7;\ r = 15$$

The curves, and, of course, those for other pairs of values $r$, $A$, have a maximum. In the design of the diode, the parameter $x_1$ must then be selected so that it corresponds to the maximum value $a_m$ of the parameter $a$ on the respective curve.

If the value of pairs associated with the maximum are designated $a_m$ and $x_{1m}$, since the voltage $V_1$ is associated with $x_{1m}$, Equation (3) provides $$N_0 z^2 = \frac{(V_1+V_0)\frac{\epsilon\epsilon_0}{q}}{\frac{1}{2}a_m x_{1m}^2 + (1-a_m)F(x_{1m})} = K. \quad (7)$$

Equation (7) provides a fixed numerical value for the product $N_0z^2$. In the desired diode, this product therefore has the fixed value $K$. nevertheless, $N_0$ and $z$ cannot be selected freely, because the absolute values of $N_0$ and $z$ determine the reverse voltage.

In accordance with the IEEE Transactions on Electron Devices Vol. 10, No. 1, January, 1963, pages 44 to 51, the product $N_0z$ must be $$N_0 z \leqq 2.84 \cdot 10^{12} \text{ for } 0.1\ \mu m \leqq z \leqq 1\ \mu m \quad (8)$$

if it is to be assured that the reverse voltage is so large that the hyperabrupt doping profile can be fully covered by the space charge zone. By combining Equations (8) and (7) the minimum condition $z_{min}$ for $z$ is provided as $$z \geqq z_{min} = \frac{K}{2.84 \cdot 10^{12}} \quad (9)$$

Since only $x_{1m} = W_1/z$ may still be selected freely, $z$ can be chosen as desired above the value of $z_{min}$. However, as $z$ increases, the value of $W_1$ increases. According to Equation (4), the required area of the p-n junction of the diode increases as $W_1$ increases. It should be attempted to make this area not unnecessarily large. Appropriately, $z$ is therefore selected with a specific margin of safety above $z_{min}$, such as, for example, $z = 1.5\ z_{min}$.

The selection of a value for $z$ as small as possible and therefore, according to Equation (8) of a value for $N_0$ as large as possible and, according to Equation (2), of the highest possible background doping $N_B = a_mN_0$ is very much compatible with the requirement for a high $Q$, or a small series resistance, of the capacitive diode.

After z has been set, the value of $N_0$ follows from Equation (7) and therewith, according to Equation (2) the background concentration of the starting material, $N_B = a_mN_0$. From the known value $x_{1m}$ may be obtained, according to Equation (5a), the space charge width as $W_1 = x_{1min}\ z$.

For a desired capacitance $C_1$, the required area of the diode then follows from Equation (4).

$$F = \frac{C_1 W_1}{\epsilon\epsilon_0} = \frac{C_1 x_{1m} z}{\epsilon\epsilon_0} \quad (10)$$

The design parameters for the tuning diode are thereby established.

A high $Q$ of the diode may be provided by making it of epitaxial wafers. For the thickness $d_{epi}$ of the epitaxial layer and the doping concentration $N_B$, the requirement is $$d_{epi} \geqq x_j + W_2 = x_j + r\ W_1$$

The following numerical example illustrative the invention. The tuning diode is desired to have a capacitance variation $r = 15$ between $V_1 = 1\ V$ and $V_2 = 12\ V$.

In a first approximation, $V_0$ is then 0.9 V and $A = 6.8$. These values produce from FIG. 4:

$$a_m = 8.3 \cdot 10^{-3}$$

with $$x_{1m} = 1.31.$$

When $V_1 = 1$ V, the value of K then follows from Equations 5a, 5b and 7 as $K = N_0z^2 = 3.31 \cdot 10^7\ cm^{-1}$ If this result is entered in Equation (9), $$z_{min} = 0.117\ \mu m$$

is provided.

Including the safety margin, z is selected as $$z = 0.176\ \mu m$$

From this follows $$N_0 = K/z^2 = 1.07 \cdot 10^{17}\ cm^{-3}$$

This enables $N_B$ to be determined as follows $$N_B = a_m N_0 = 8.9 \cdot 10^{14}\ cm^{-3}$$

Equation (5a) provides the width of the space charge as $$W_1 = x_{1m} z = 0.231\ \mu m$$

For a desired $C_1 = 160\ pF$, Equation (10) provides $$F = 34.8 \cdot 10^{-4}\ cm^2$$

After the initial data has been determined, it is possible to manufacture the tuning diode.

In a silicon basic material or substrate with a doping concentration $N_B = 8.9 \cdot 10^{14}$ phosphorus atoms/cm$^3$, a retrograded doping profile is produced by a first diffusion according to Equation (1)

$$N(W) = 8.9 \cdot 10^{14} + 1.07 \cdot 10^{17}\ (1\text{-}8.3 \cdot 10^{-3})\ e^{-W/0.176}$$

A heavily p-doped zone is formed by a second diffusion with boron in such a manner that the doping profile shown in FIG. 1 is produced with the given values for $N_0$, $N_B$ and $z$.

The tuning diode of the invention has no inversion points, since the value of $a = 8.3 \cdot 10^{-3}$ is larger than $6.1 \cdot 10^{-3}$. Furthermore, the variations of the electrical properties of different diodes of the same type, produced in accordance with the same method, are small.

Figure 5:
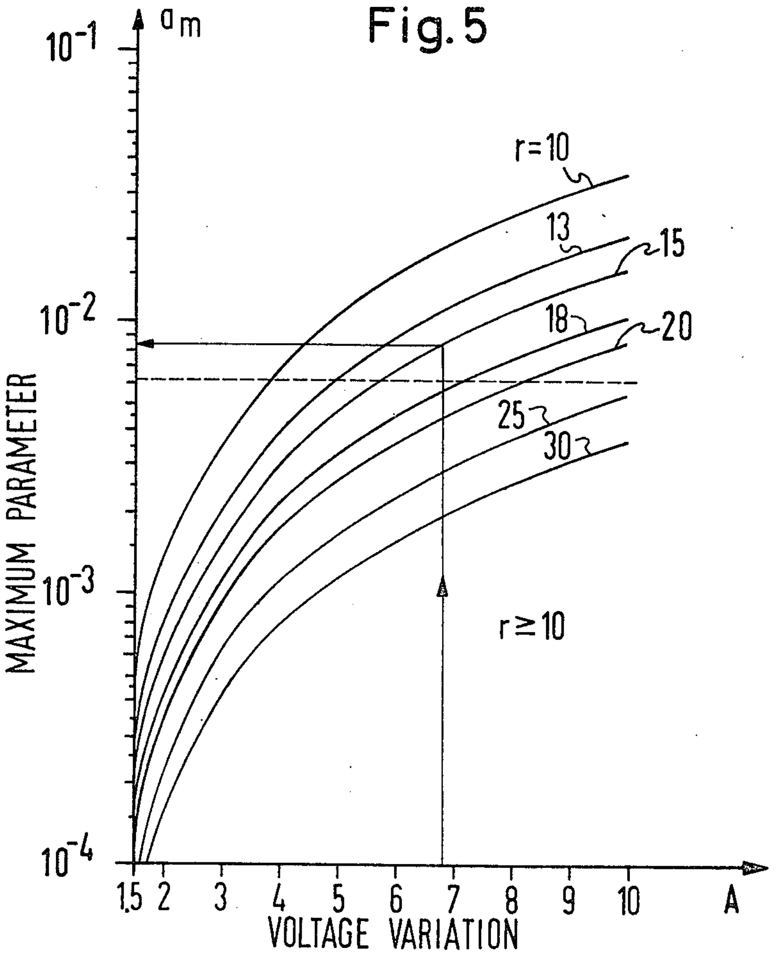
FIG. 5 is a graphical presentation to enable calculation of $a_m$.

FIG. 5 and 6 show additional diagrams which permit a rapid determination of $a_m$ and $x_{1m}$ if the values of $A$ and $r$ are given, provided $r$ is greater than 10. In FIG. 5, the abscissa represents $A$ and the ordinate represents $a_m$. In FIG. 6, the abscissa represents $A$ and the ordinate represents $x_{1m}$. By way of example, the value $a_m = 8.3 \cdot 10^{-3}$ is immediately obtained from FIG. 5 for $A = 6.8$ and $r = 15$. The broken line in FIG. 5 indicates the value $a = 6.1 \cdot 10^3$, above which inversion points in the capacitance-voltage curve of the diode may be avoided. In the example, FIG. 6 provides $x_{1m} = 1.31$.

While the invention has been described by means of specific examples and in a specific embodiment, we do not wish to be limited thereto, for obvious modifications will occur to those skilled in the art without departing from the spirit and scope of the invention.

I claim:

1. A method of manufacture of a hypersensitive tuning diode comprising the steps of background doping a concentration $N_B$ of one conductivity type in a semiconductor body; diffusion-doping a zone with a retrograded doping profile of the one conductivity type; and heavily diffusion-doping a zone of the other conductivity type to form a p-n junction between the zone of the one conductivity type and the zone of the other conductivity type and wherein for desired values $$A = \frac{V_2 + V_0}{V_1 + V_0}$$

and $r = C_1C/C_2$ the ratio $W_1/z$ is such that the parameter $a = N_B/N_O$ has its maximum possible value, $N_Oz$ has a maximum value of $2.84 \cdot 10^{12}$ cm$^{-2}$, the area of the p-n junction is as small as possible, $z$ is a quantity indicating the gradient of the doping profile having a length dimensions, $V_O$ is the offset voltage, $A$ is the voltage variation between the voltages $V_2$ and $V_1$, $C_1$ is the capacitance at the voltage $V_1$, $C_2$ is the capacitance at the voltage $V_2$, $r$ is the capacitance variation between the capacitances $C_1$ and $C_2$, $W_1$ is the space charge width at the voltage $V_1$ and $N_O$ is the doping concentration at the point of the p-n junction after the first diffusion.

2. A method for producing a hypersensitive tuning diode comprising the steps of doping a semiconductor body with a background doping concentration $N_B$ of one conductivity type, diffusing a doped zone with a retrograded doping profile of the one conductivity type, and diffusing a heavily doped zone of the other conductivity type forming a p-n junction between the zone of the one conductivity type and the zone of the other conductivity type, the diode having desired values of $$A = \frac{V_2 + V_0}{V_1 + V_0}$$

and $r = C_1/C_2$, wherein the ratio $W_1/z$ is such that parameter $a = N_B/N_O$ is at a maximum value at least equal to $6.1 \cdot 10^{-3}$, the area of the p-n junction is minimized, $V_O$ being the offset voltage, $A$ being the voltage variation between the voltages $V_2$ and $V_1$, $C_1$ being the capacitance at the voltage $V_1$, $C_2$ being the capacitance at the voltage $V_2$, $r$ being the capacitance variation between the capacitances $C_1$ and $C_2$, and $W_1$ being the space charge width at the voltage $V_1$.

* * * * *